United States Patent
Ahn et al.

(10) Patent No.: US 11,137,693 B2
(45) Date of Patent: Oct. 5, 2021

(54) PELLICLE HOLDER, PELLICLE INSPECTION APPARATUS, AND PELLICLE INSPECTION METHOD

(71) Applicant: IUCF-HYU (INDUSTRY-UNIVERSITY COOPORATION FOUNDATION HANYANG UNIVERSITY), Seoul (KR)

(72) Inventors: Jin Ho Ahn, Seoul (KR); Young Woong Kim, Seoul (KR); Dong Gon Woo, Seoul (KR)

(73) Assignees: IUCF-HYU (INDUSTRY-UNIVERSITY COOPERATION FOUNDATION HANYANG UNIVERSITY), Seoul (KR); FOUNDATION HANYANG UNIVERSITY) Seoul, R (KR)

( * ) Notice: Subject to any disclaimer, the term of this patent is extended or adjusted under 35 U.S.C. 154(b) by 0 days.

(21) Appl. No.: 16/690,254

(22) Filed: Nov. 21, 2019

(65) Prior Publication Data

US 2020/0174376 A1 Jun. 4, 2020

(30) Foreign Application Priority Data

Nov. 30, 2018 (KR) .......... 10-2018-0152330
Jun. 3, 2019 (KR) .......... 10-2019-0065308

(51) Int. Cl.
*G03F 7/20* (2006.01)
*G03F 1/64* (2012.01)

(52) U.S. Cl.
CPC .............. *G03F 7/7085* (2013.01); *G03F 1/64* (2013.01); *G03F 7/70983* (2013.01)

(58) Field of Classification Search
CPC . G03F 1/64; G03F 1/84; G03F 7/7085; G03F 7/70983; G03F 1/52; G03F 1/62; G03F 1/66; G03F 7/70033; G03F 7/70516; G03F 7/70716
See application file for complete search history.

(56) References Cited

U.S. PATENT DOCUMENTS

| | | | | |
|---|---|---|---|---|
| 5,494,169 | A * | 2/1996 | Matsuoka | ................ H05K 7/12 206/722 |
| 8,446,570 | B2 * | 5/2013 | Del Puerto | ....... H01L 21/67353 355/75 |
| 2005/0157288 | A1 * | 7/2005 | Van Peski | ................ G03F 1/64 355/75 |
| 2015/0212433 | A1 * | 7/2015 | Kim | .................... G03F 7/70983 355/30 |

(Continued)

FOREIGN PATENT DOCUMENTS

| | | | |
|---|---|---|---|
| JP | 09258433 | A * | 10/1997 |
| JP | 2007-334212 | A | 12/2007 |

(Continued)

*Primary Examiner* — Deoram Persaud
(74) *Attorney, Agent, or Firm* — Sughrue Mion, PLLC

(57) ABSTRACT

Provided is a pellicle holder. The pellicle holder includes: an outer frame formed therein with a pellicle seating space; and a plurality of holding legs extending in a direction from the outer frame toward a center of the pellicle seating space, wherein the holding leg is extended or contracted in the extension direction and has one end on which a portion of a pellicle is mounted to support the pellicle.

10 Claims, 18 Drawing Sheets

(56) References Cited

U.S. PATENT DOCUMENTS

| | | | |
|---|---|---|---|
| 2015/0293460 A1* | 10/2015 | Takehisa | G03F 1/84 355/67 |
| 2016/0305926 A1* | 10/2016 | Rachet | G02B 21/0076 |
| 2017/0090281 A1* | 3/2017 | Goldfarb | G03F 1/62 |
| 2018/0373141 A1* | 12/2018 | Brouns | G03F 1/66 |
| 2019/0025717 A1* | 1/2019 | Van Der Meulen | G03F 1/64 |
| 2020/0133116 A1* | 4/2020 | Hamada | G03F 7/70908 |
| 2020/0174382 A1* | 6/2020 | Chang | G03F 1/64 |
| 2021/0080824 A1* | 3/2021 | Ishikawa | G03F 1/64 |
| 2021/0116802 A1* | 4/2021 | Lee | G03F 1/64 |

FOREIGN PATENT DOCUMENTS

| | | |
|---|---|---|
| KR | 1993-0005113 A | 3/1993 |
| KR | 10-2007-0019174 A | 2/2007 |
| KR | 10-2011-0101069 A | 9/2011 |
| KR | 101738887 B1 | 6/2017 |
| KR | 10-2017-0110759 A | 10/2017 |
| KR | 10-2018-0120864 A | 11/2018 |

\* cited by examiner (a)

(b)

PELLICLE HOLDER, PELLICLE INSPECTION APPARATUS, AND PELLICLE INSPECTION METHOD

BACKGROUND OF THE INVENTION

1. Field of the Invention

The present invention relates to a pellicle holder, a pellicle inspection apparatus, and a pellicle inspection method, and more particularly, to a pellicle holder, a pellicle inspection apparatus, and a pellicle inspection method, capable of inspecting extreme ultraviolet (EUV) light transmitted through a pellicle to detect a defect of the pellicle.

2. Description of the Prior Art

Since the width of a circuit line of a semiconductor device has rapidly scaled down, there is a limitation in forming a fine pattern with a currently-used immersion ArF exposure device using a light source having a wavelength band of 193 nm. In order to form the fine pattern without improving the light source and the exposure device, techniques such as double exposure or quadruple exposure are applied. However, in the manufacture of the semiconductor device where mass production is important, the techniques may cause problems such as an increase in the number of processes, an increase in a process price, and a decrease in the number of processed articles per hour.

In order to solve the problems, a next-generation exposure device which adopts an extreme ultraviolet lithography technique using extreme ultraviolet light having a wavelength of 13.5 nm as a light source has been developed. Since the light having the wavelength of 13.5 nm, which is used in the extreme ultraviolet lithography technique, is absorbed in almost every materials, the light having the wavelength of 13.5 nm is used in reflective reticles similar to mirrors rather than conventional transmissive reticles. When impurities such as dust or foreign substances adhere to the reticle, the light may be absorbed or reflected due to the impurities, so that a transferred pattern may be damaged, resulting in a decrease in performance or yield of a semiconductor device or a liquid crystal display panel.

Therefore, a method of using a pellicle has been performed in order to prevent the impurities from adhering to a surface of the reticle. For this reason, researches on development of a pellicle having a thin thickness and a high transmittance with respect to the extreme ultraviolet light have been actively conducted. While researches on a detection apparatus and a detection method for a defect in a mask, a wafer, and/or a thin film have been actively conducted until now, since a pellicle for an extreme ultraviolet exposure process is in an early stage of the research, an inspection apparatus and an inspection technique for basic characteristics of the pellicle have not yet been implemented.

For example, Korean Patent Registration No. 1336946 B1 (Application No. 2012-0135492 A, Applicant: Korea Basic Science Institute) discloses a method of manufacturing a failure analysis apparatus for tracking and analyzing a defect location with high accuracy by measuring local heat generation that occurs due to defects in semiconductor elements such as a substrate and a thin film with submicron spatial resolution and a non-contact manner and allowing measurement data to overlap a semiconductor fine pattern image.

Recently, in order to improve process efficiency of a semiconductor manufacturing process, researches have been conducted to apply a high-power light source to an extreme ultraviolet lithography exposure device. For this reason, there is an increasing demand for the pellicle for the extreme ultraviolet exposure process, which has high performance and a high transmittance, in order to improve productivity of the exposure process. Accordingly, researches on a pellicle inspection apparatus and a pellicle inspection method for measuring a transmittance of a pellicle at a low cost by using a simplified device and an easy operation scheme, and evaluating whether the pellicle is defective have been required.

DOCUMENTS OF RELATED ART

Patent Documents (Patent document 1) Korean Patent Registration No. 1336946 B1

SUMMARY OF THE INVENTION

One technical object of the present invention is to provide a pellicle holder, a pellicle inspection apparatus, and a pellicle inspection method, capable of easily mounting pellicles of various sizes.

Another technical object of the present invention is to provide a pellicle holder, a pellicle inspection apparatus, and a pellicle inspection method, capable of detecting a defect of a pellicle in a simplified process.

Still another technical object of the present invention is to provide a pellicle holder, a pellicle inspection apparatus, and a pellicle inspection method, in which an inspection time and an inspection cost are reduced.

The technical objects of the present invention are not limited to the above-described objects.

In order to achieve the technical objects, the present invention provides a pellicle holder.

In accordance with an aspect of the present invention, the pellicle holder includes: an outer frame formed therein with a pellicle seating space; and a plurality of holding legs extending in a direction from the outer frame toward a center of the pellicle seating space, wherein the holding leg is extended or contracted in the extension direction and has one end on which a portion of a pellicle is mounted to support the pellicle.

According to one embodiment, the holding leg may include a holding head branched from the one end, and the holding head may have a branch shape.

According to one embodiment, the holding head may be divided into an upper region and a lower region having a lower level than the upper region, and the upper region and the lower region may be configured as a step shape.

According to one embodiment, a frame of the pellicle may be mounted on the lower region of the holding head.

According to one embodiment, the holding legs may include first to fourth holding legs, the frame of the pellicle may include first to fourth corners, the first corner may be mounted on the lower region of the holding head included in the first holding leg, the second corner may be mounted on the lower region of the holding head included in the second holding leg, the third corner may be mounted on the lower region of the holding head included in the third holding leg, and the fourth corner may be mounted on the lower region of the holding head included in the fourth holding leg.

According to one embodiment, the holding leg may support the pellicle such that the pellicle is disposed on a mask, which reflects extreme ultraviolet (EUV) light, to face the mask while being spaced apart from the mask.

According to one embodiment, the outer frame may include a plurality of pellicle seating spaces, and a plurality of pellicles may be seated in the pellicle seating spaces, respectively.

According to one embodiment, pellicles having mutually different sizes may be supported as the holding leg is extended or contracted.

In order to achieve the technical objects, the present invention provides a pellicle inspection method.

In accordance with an aspect of the present invention, the pellicle inspection method for inspecting a defect of a pellicle seated on a pellicle holder according to the above embodiment includes: a holding leg adjustment operation of extending or contracting a holding leg in an extension direction of the holding leg; a pellicle seating operation of seating the pellicle in a pellicle seating space; a light irradiation operation of irradiating extreme ultraviolet (EUV) light toward a splitter configured to reflect a portion of the EUV light and transmit a remaining portion of the EUV light; a first detection operation of measuring the EUV light reflected from the splitter; a light reflection operation of reflecting the EUV light transmitted from the splitter such that the EUV light transmitted from the splitter is directed to the pellicle; a second detection operation of measuring the EUV light which is transmitted through the pellicle, reflected by an EUV mask, and retransmitted through the pellicle; and a defect measurement operation of identifying a defect of the pellicle by comparing the EUV light measured in the first detection operation with the EUV light measured in the second detection operation.

In order to achieve the technical objects, the present invention provides a pellicle inspection apparatus.

In accordance with an aspect of the present invention, the pellicle inspection apparatus for protecting a mask used in an extreme ultraviolet (EUV) lithography process includes: a light source configured to irradiate EUV light; a splitter configured to transmit a portion of the EUV light irradiated from the light source and reflect a remaining portion of the EUV light; a first detector configured to measure the EUV light reflected from the splitter; a reflector configured to reflect the EUV light transmitted through the splitter and provide the EUV light to a pellicle; a second detector configured to measure the EUV light which is transmitted through the pellicle, reflected by the mask, and retransmitted through the pellicle; and a pellicle holder configured to arrange the pellicle on the mask such that the pellicle faces the mask while being spaced apart from the mask, wherein a defect of the pellicle is inspected by comparing the EUV light measured by the first detector with the EUV light measured by the second detector.

According to one embodiment, the pellicle holder may include: an outer frame formed therein with a pellicle seating space; and a plurality of holding legs extending in a direction from the outer frame toward a center of the pellicle seating space, and the holding leg may be extended or contracted in the extension direction and may have one end on which a portion of the pellicle is mounted to support the pellicle.

According to one embodiment, the reflector may include: a first reflecting mirror configured to reflect the EUV light transmitted through the splitter; and a second reflecting mirror configured to receive the EUV light reflected from the first reflecting mirror and reflect the received light to the pellicle.

The pellicle holder according to the embodiment of the present invention includes: an outer frame formed therein with a pellicle seating space; and a plurality of holding legs extending in a direction from the outer frame toward a center of the pellicle seating space, wherein the holding leg is extended or contracted in the extension direction and has one end on which a portion of a pellicle is mounted to support the pellicle. Accordingly, pellicles of various sizes can be easily supported in a state in which the pellicles face the mask while being spaced apart from the mask.

In addition, the pellicle inspection apparatus according to the embodiment of the present invention includes: a light source configured to irradiate EUV light; a splitter configured to transmit a portion of the EUV light irradiated from the light source and reflect a remaining portion of the EUV light; a first detector configured to measure the EUV light reflected from the splitter; a reflector configured to reflect the EUV light transmitted through the splitter and provide the EUV light to a pellicle; a second detector configured to measure the EUV light which is transmitted through the pellicle, reflected by a mask, and retransmitted through the pellicle; and a pellicle holder configured to arrange the pellicle on the mask such that the pellicle faces the mask while being spaced apart from the mask, wherein a defect of the pellicle is inspected by comparing the EUV light measured by the first detector with the EUV light measured by the second detector.

Accordingly, a pellicle inspection apparatus capable of easily evaluating image transfer characteristics of the mask as well as the defect of the pellicle can be provided. In addition, a pellicle inspection apparatus capable of inspecting the defect of the pellicle with a simplified process and a reduced cost in the same transmittance measurement environment as in the case of using an exposure device which is expensive equipment can be provided.

DETAILED DESCRIPTION OF THE EXEMPLARY EMBODIMENTS

Figure 1:
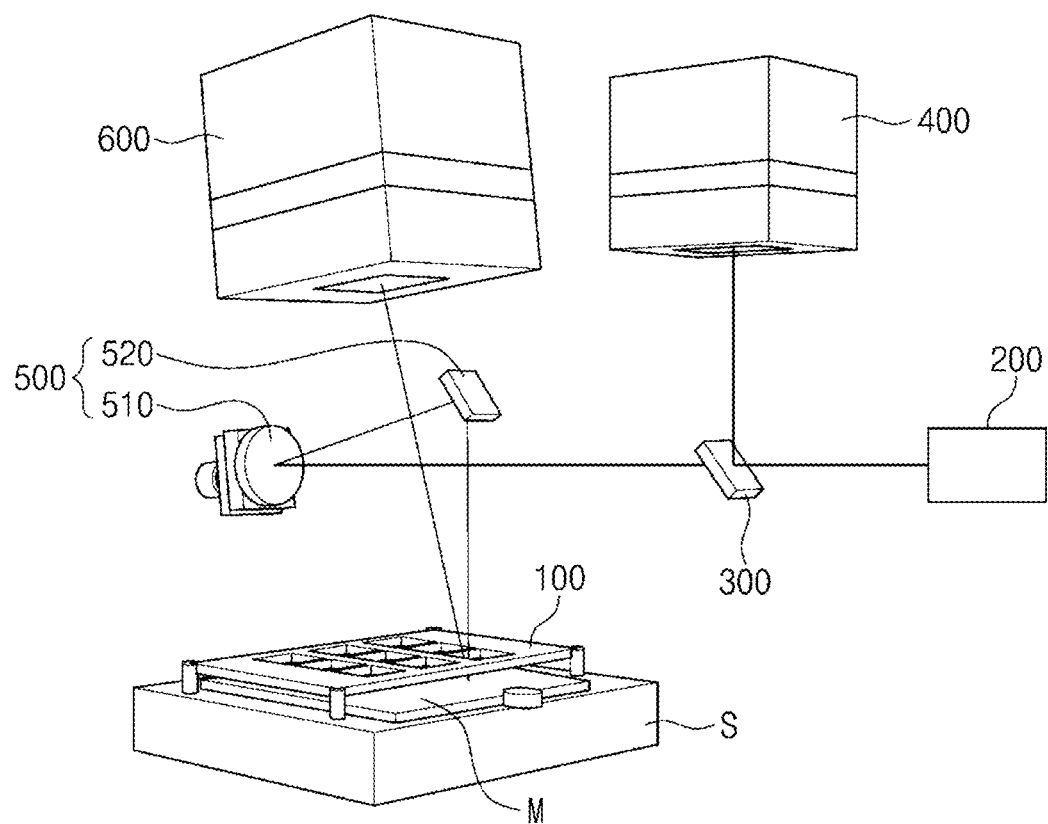
FIG. 1 is a view illustrating a pellicle inspection apparatus according to an embodiment of the present invention.

Hereinafter, preferred embodiments of the present invention will be described in detail with reference to the accompanying drawings. However, the technical spirit of the present invention is not limited to the embodiments, but may be realized in different forms. The embodiments introduced here are provided to sufficiently deliver the spirit of the present invention to those skilled in the art so that the disclosed contents may become thorough and complete.

When it is mentioned in the specification that one element is on another element, it means that the first element may be directly formed on the second element or a third element may be interposed between the first element and the second element. Further, in the drawings, the thicknesses of the membrane and areas are exaggerated for efficient description of the technical contents.

Further, in the various embodiments of the present invention, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combination thereof described in the specification are present, and may be understood that one or more other features, numbers, step, elements, or combinations thereof may be added. Further, in the specification, the term "connection" may be used to include both indirectly and directly connecting a plurality of elements.

Further, in the following description of the present invention, a detailed description of known functions and configurations incorporated herein will be omitted when it may make the subject matter of the present invention unnecessarily unclear.

Figure 2:
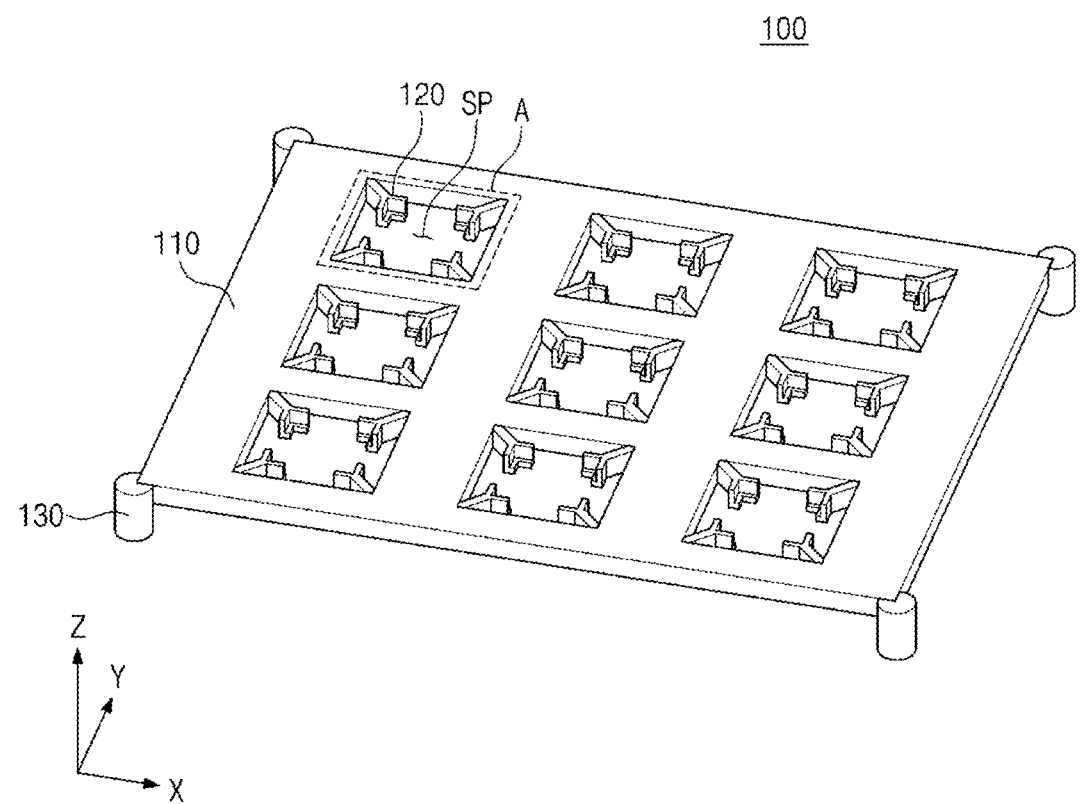
FIG. 2 is a view showing a pellicle holder according to the embodiment of the present invention.
Figure 3:
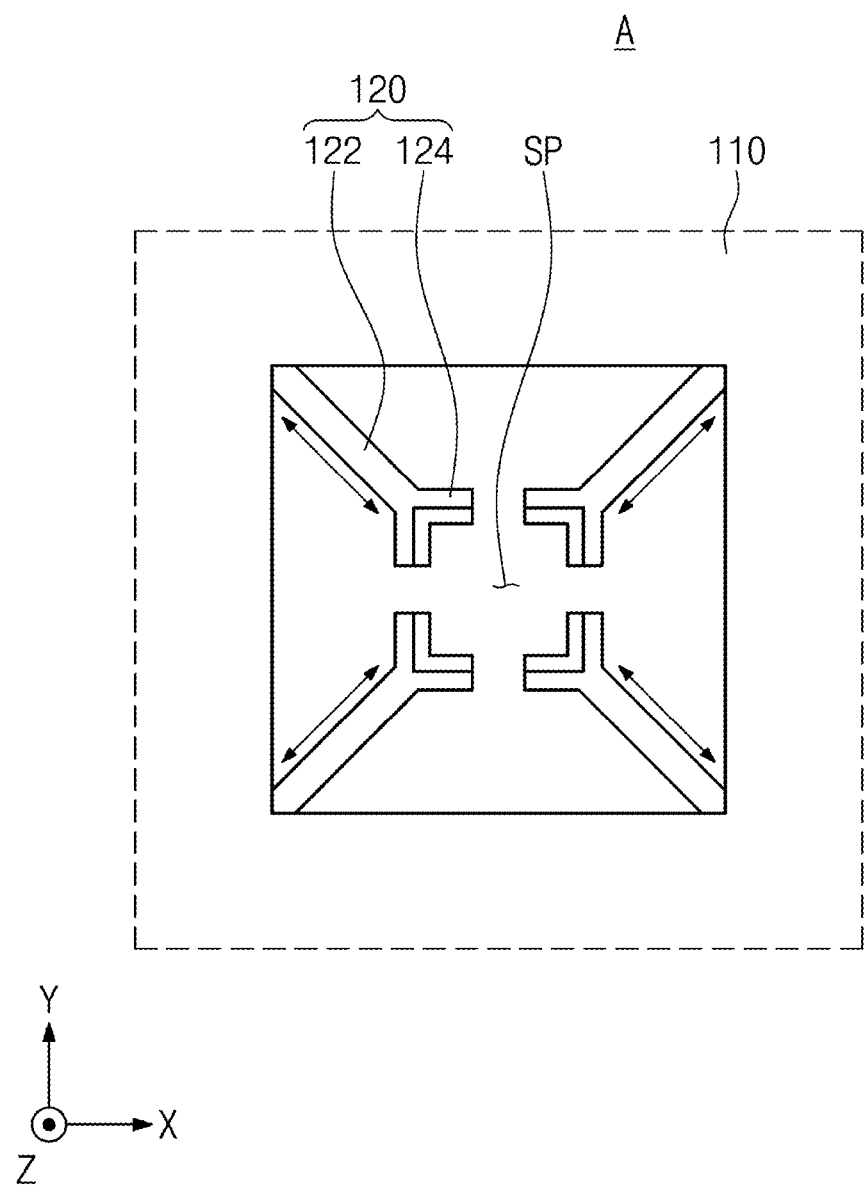
FIGS. 3 and 4 are plan views showing portion A of FIG. 2.
Figure 4:
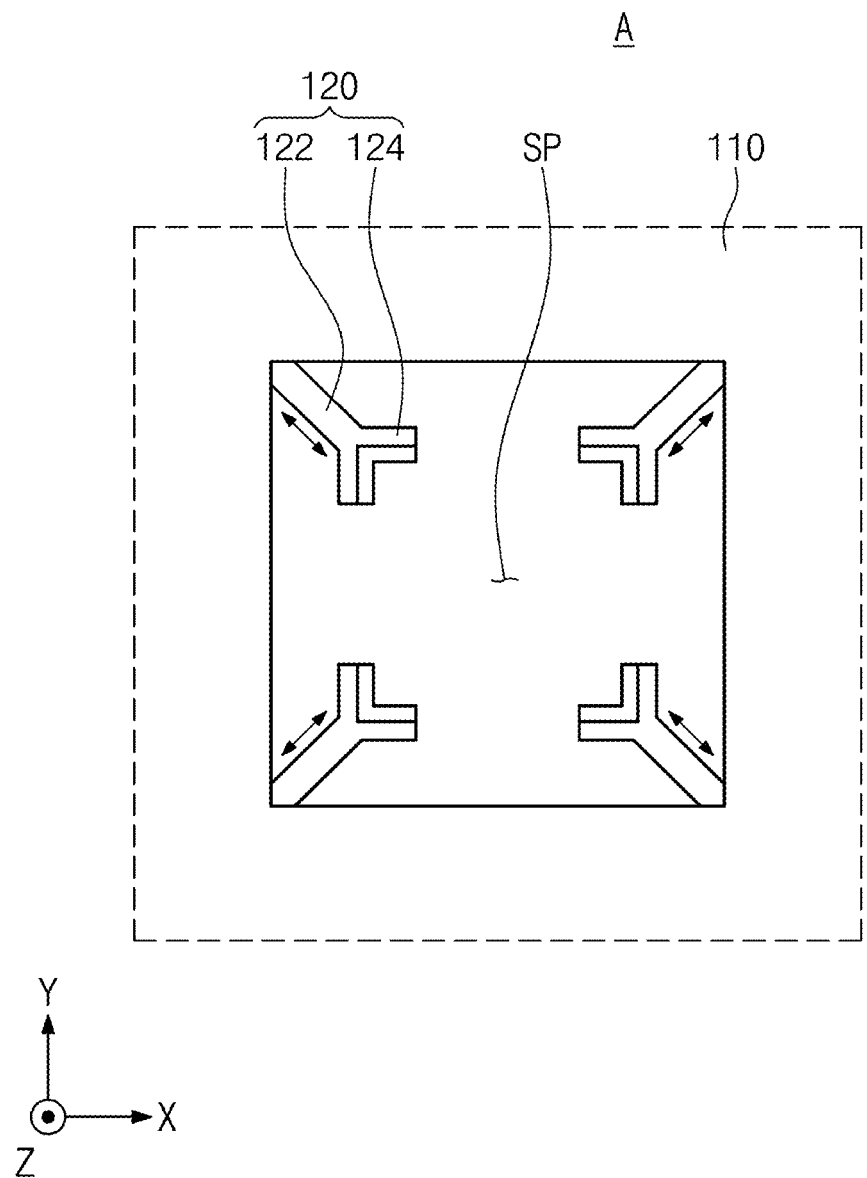
Figure 5:
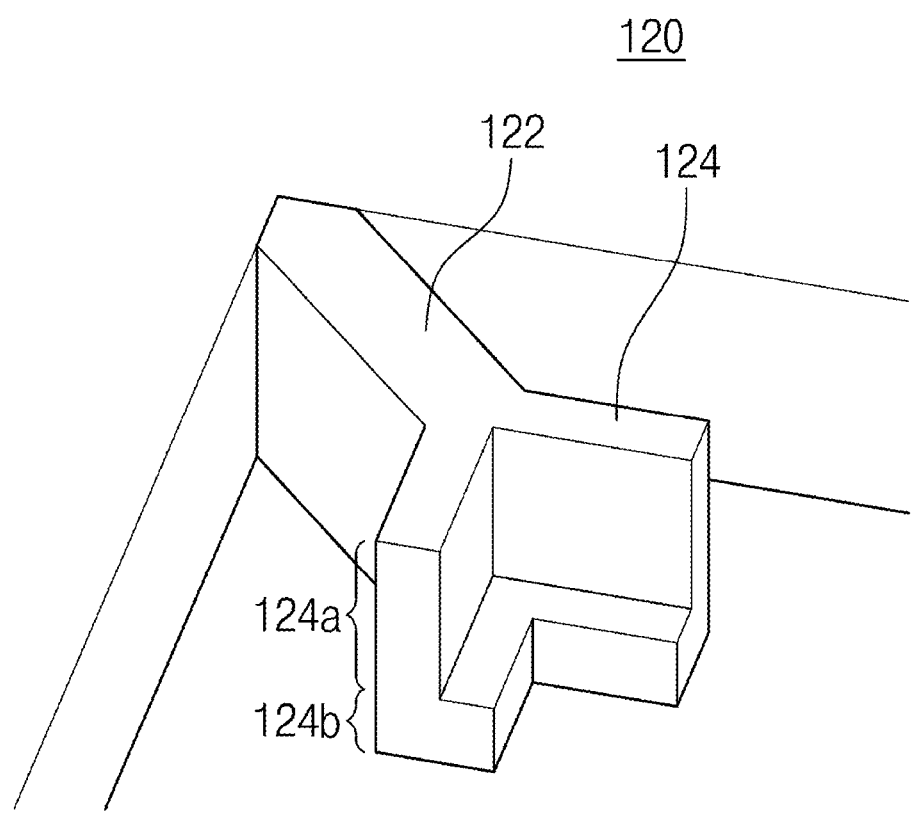
FIGS. 5 and 6 are views illustrating a holding leg included in the pellicle holder according to the embodiment of the present invention.
Figure 6:
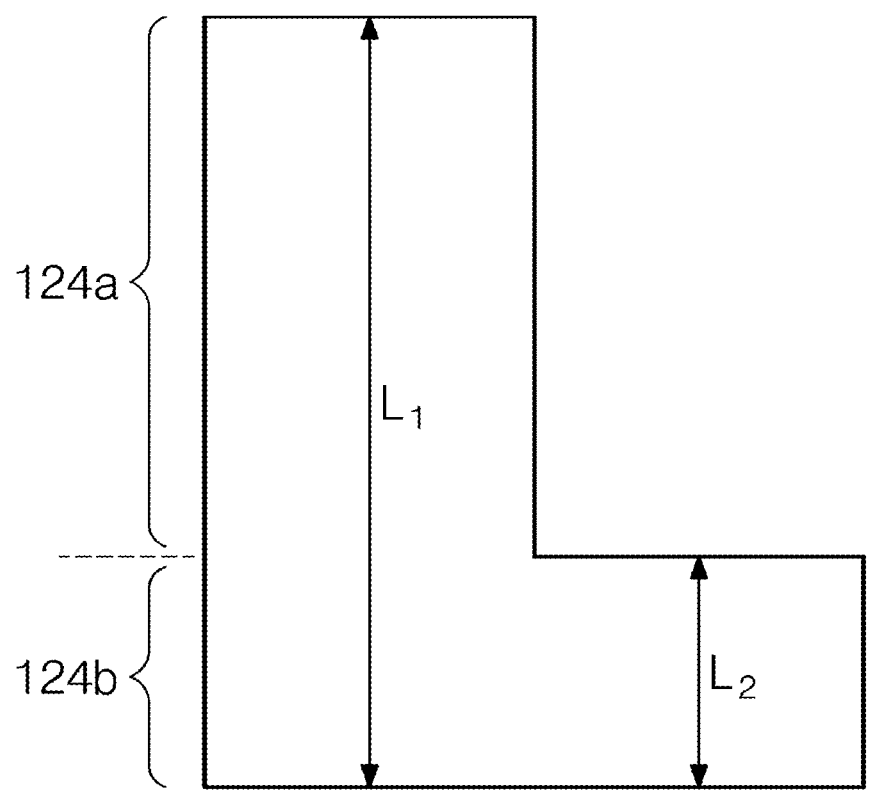
Figure 7:
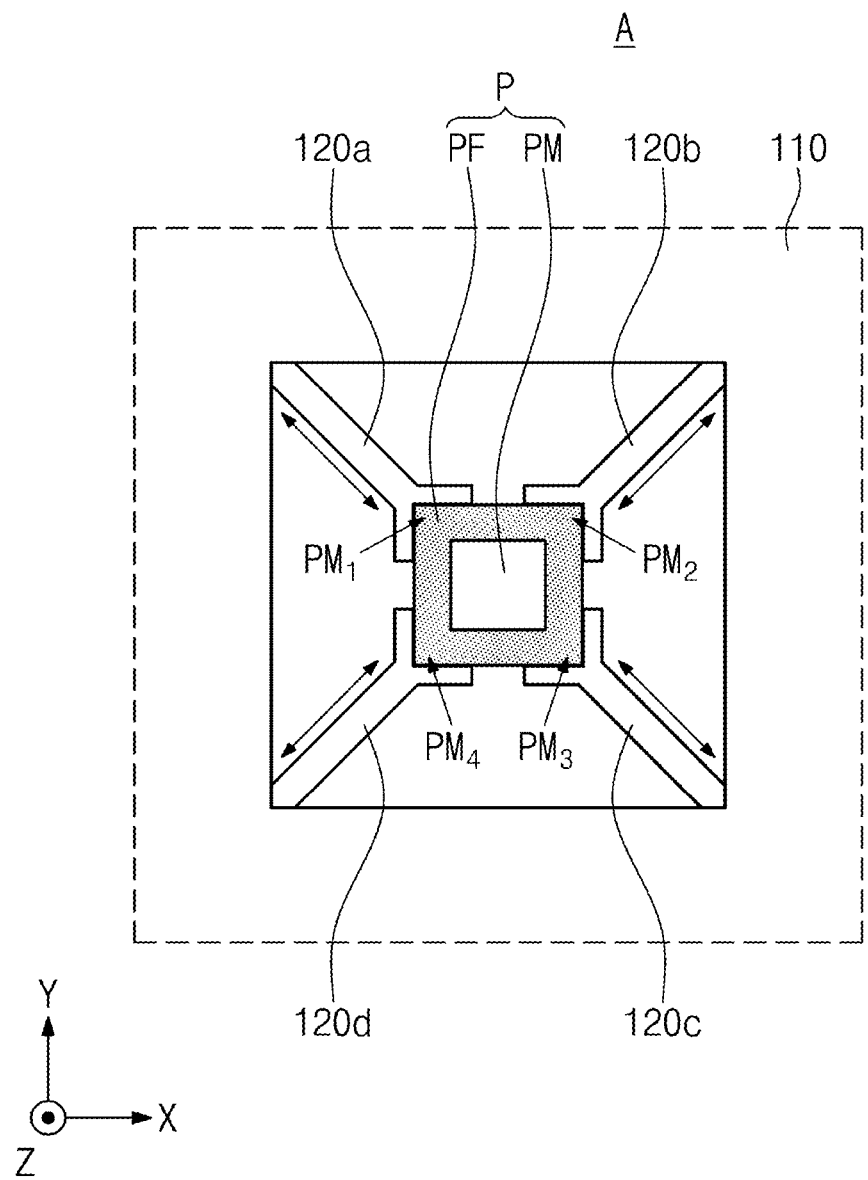
FIGS. 7 and 8 are views illustrating a state in which a pellicle is disposed in the pellicle holder according to the embodiment of the present invention.
Figure 8:
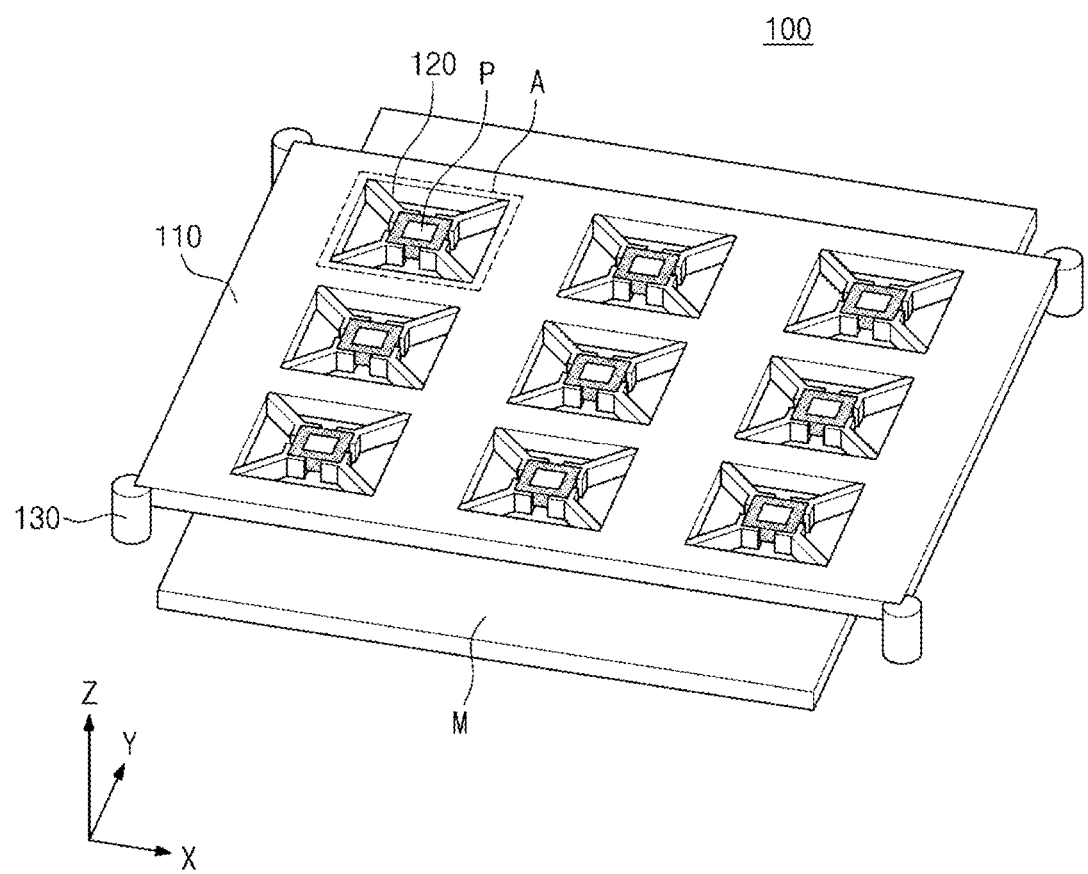

FIG. 1 is a view illustrating a pellicle inspection apparatus according to an embodiment of the present invention, FIG. 2 is a view showing a pellicle holder according to the embodiment of the present invention, FIGS. 3 and 4 are plan views showing portion A of FIG. 2, FIGS. 5 and 6 are views illustrating a holding leg included in the pellicle holder according to the embodiment of the present invention, and FIGS. 7 and 8 are views illustrating a state in which a pellicle is disposed in the pellicle holder according to the embodiment of the present invention.

Referring to FIG. 1, a pellicle inspection apparatus according to the embodiment of the present invention may include a pellicle holder 100, a light source 200, a splitter 300, a first detector 400, a reflector 500, and a second detector 600. Hereinafter, each of the components will be described.

Referring to FIGS. 2 to 8, the pellicle holder 100 may include an outer frame 110, a holding leg 120, and a support member 130. According to one embodiment, the outer frame 110 may have a rectangular shape having a side extending in a first direction and a side extending in a second direction perpendicular to the first direction. For example, the first direction may be an X-axis direction shown in FIG. 2. Meanwhile, the second direction may be a Y-axis direction shown in FIG. 2.

The outer frame 110 may be formed therein with a pellicle seating space SP. A pellicle P may be seated in the pellicle seating space SP. According to one embodiment, a plurality of pellicle seating spaces SP may be disposed in the outer frame 110. A plurality of pellicles P may be seated in the pellicle seating spaces SP, respectively. According to one embodiment, the pellicle P may include a pellicle membrane PM, and a pellicle frame PF surrounding the pellicle membrane PM. The pellicle seating space SP and the pellicle P will be described in more detail below.

The holding leg 120 may extend in a direction from the outer frame 110 toward a center of the pellicle seating space SP. According to one embodiment, a plurality of holding legs 120 may be arranged around the pellicle seating space SP. For example, as shown in FIGS. 2 to 4, four holding legs 120 may be arranged around the pellicle seating space SP. The number and positions of the holding legs 120 are provided for illustrative purposes, and are not limited to the number and positions described above.

As described above, when the outer frame 110 includes a plurality of pellicle seating spaces SP, the holding legs 120 may be arranged around each of the pellicle seating spaces SP. In other words, the holding legs 120 arranged around each of the pellicle seating spaces SP may have the same structure. Hereinafter, the pellicle seating space SP and the holding leg 120 will be described while focusing on a portion A of FIG. 2 (when four holding legs are disposed in one pellicle seating space) as a representative example.

According to one embodiment, the holding leg 120 may include a holding body 122 and a holding head 124. The holding body 122 may have a shape extending in the direction from the outer frame 110 toward the center of the pellicle seating space SP. The holding head 124 may branch from one end of the holding body 122 to have a branch shape.

According to one embodiment, the holding head 124 may be divided into an upper region 124a and a lower region 124b. The upper region 124a of the holding head 124 may have a first level $L_1$. Meanwhile, the lower region 124b of the holding head 124 may have a second level $L_2$. The second level $L_2$ may be lower than the first level $L_1$. Accordingly, the upper region 124a and the lower region 124b may be configured as a step shape.

The pellicle frame PF may be mounted on the lower region 124b of the holding head 124. In more detail, a corner portion of the pellicle frame PF may be mounted on the lower region 124b. In addition, mutually different corner portions of the pellicle frame PF may be mounted on the lower region 124b of the holding head 124 included in each of the holding legs 120 arranged around the pellicle seating space SP.

For example, when first to fourth holding legs 120a, 120b, 120c, and 120d are arranged around the pellicle seating space SP, and the pellicle frame PF has first to fourth corners $PM_1$, $PM_2$, $PM_3$, and $PM_4$, the first corner $PM_1$ of the pellicle frame PF may be mounted on the lower region 124b of the holding head 124 included in the first holding leg 120a. In addition, the second corner $PM_2$ of the pellicle frame PF may be mounted on the lower region 124b of the holding head 124 included in the second holding leg 120b. In addition, the third corner $PM_3$ of the pellicle frame PF may be mounted on the lower region 124b of the holding head 124 included in the third holding leg 120c. In addition, the fourth corner $PM_4$ of the pellicle frame PF may be mounted on the lower region 124b of the holding head 124 included in the fourth holding leg 120d.

Therefore, the pellicle frame PF may be supported by the holding leg 120, so that the pellicle P may be seated on the pellicle holder 100. In addition, when the pellicle frame PF is supported by the holding leg 120, the pellicle membrane PM may face a mask M, which will be described below, while being spaced apart from the mask M. Accordingly, when extreme ultraviolet (EUV) light is provided to the pellicle P, the EUV light may be transmitted through the pellicle P and reflected by the mask M that will be described below. The detailed description thereof will be given below.

According to one embodiment, the support member 130 may be disposed on a bottom surface of the outer frame 110. The support member 130 may support the outer frame 110 from a stage S on which the mask M, which will be described below, is disposed. In addition, the support member 130 may space the outer frame 110 apart from the stage S by a predetermined distance. Furthermore, the support member 130 may space the outer frame 110 apart from the mask M that will be described below by a predetermined distance. Accordingly, the pellicle P seated on the pellicle holder 100 may be spaced apart from the mask M that will described below. In this case, contamination and damages of the mask M due to contact between the pellicle P and the mask M may be minimized.

In other words, the pellicle holder 100 according to the embodiment of the present invention includes: an outer frame 110 formed therein with a pellicle seating space SP; and a plurality of holding legs 120 extending in a direction from the outer frame 110 toward a center of the pellicle seating space SP, wherein the holding leg 120 is extended or contracted in the extension direction and has one end on which a portion of a pellicle P is mounted to support the pellicle P. Accordingly, pellicles of various sizes can be easily supported in a state in which the pellicles face the mask while being spaced apart from the mask.

Figure 9:
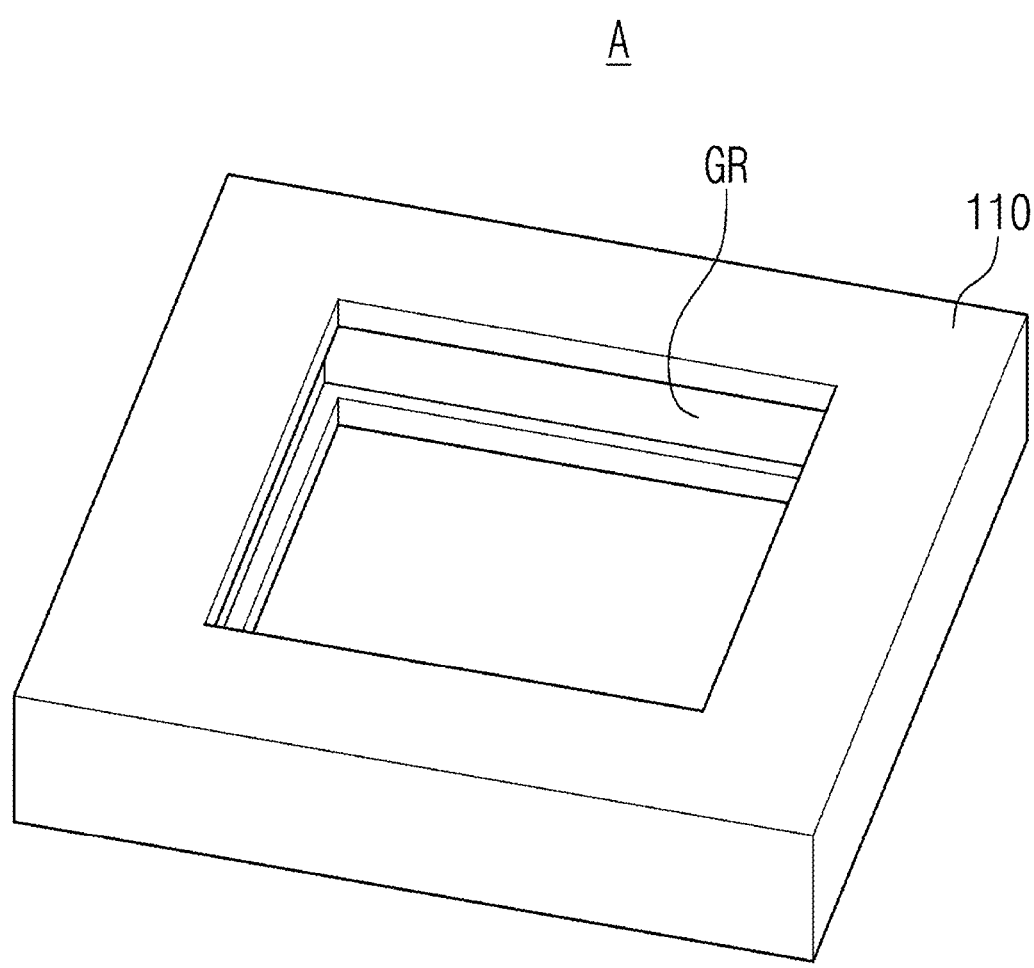
FIGS. 9 to 11 are views illustrating a pellicle holder according to a modified example of the present invention.
Figure 10:
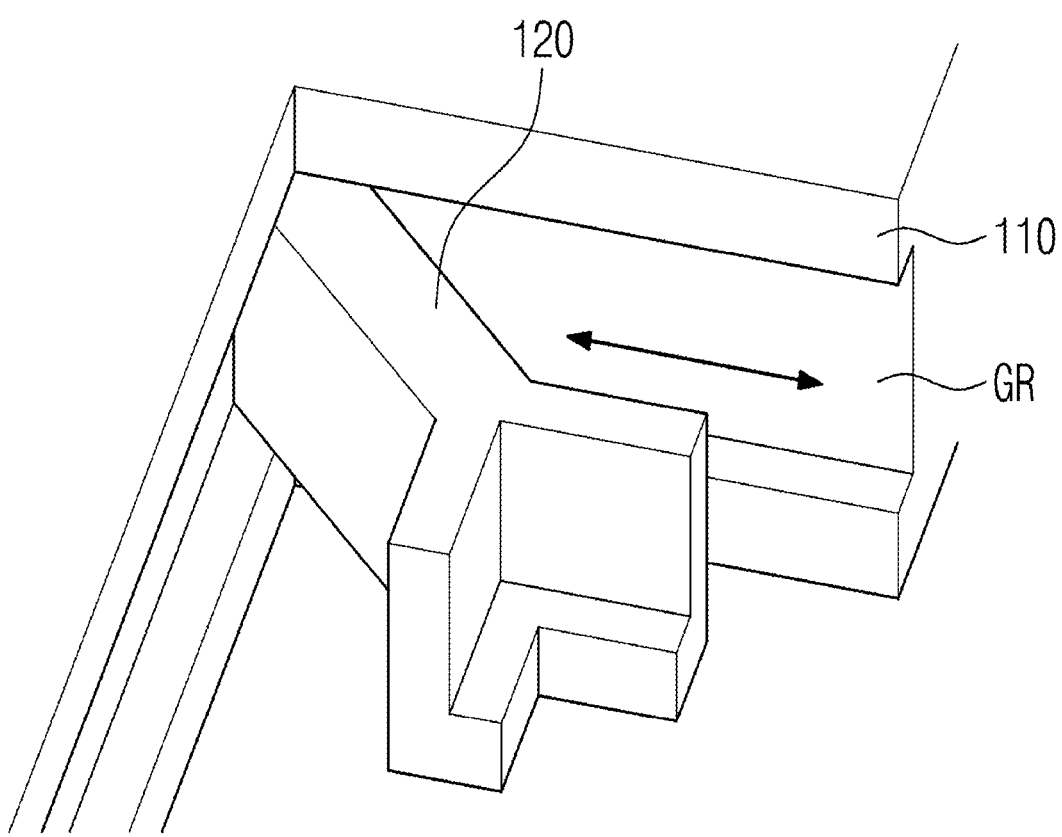
Figure 11:
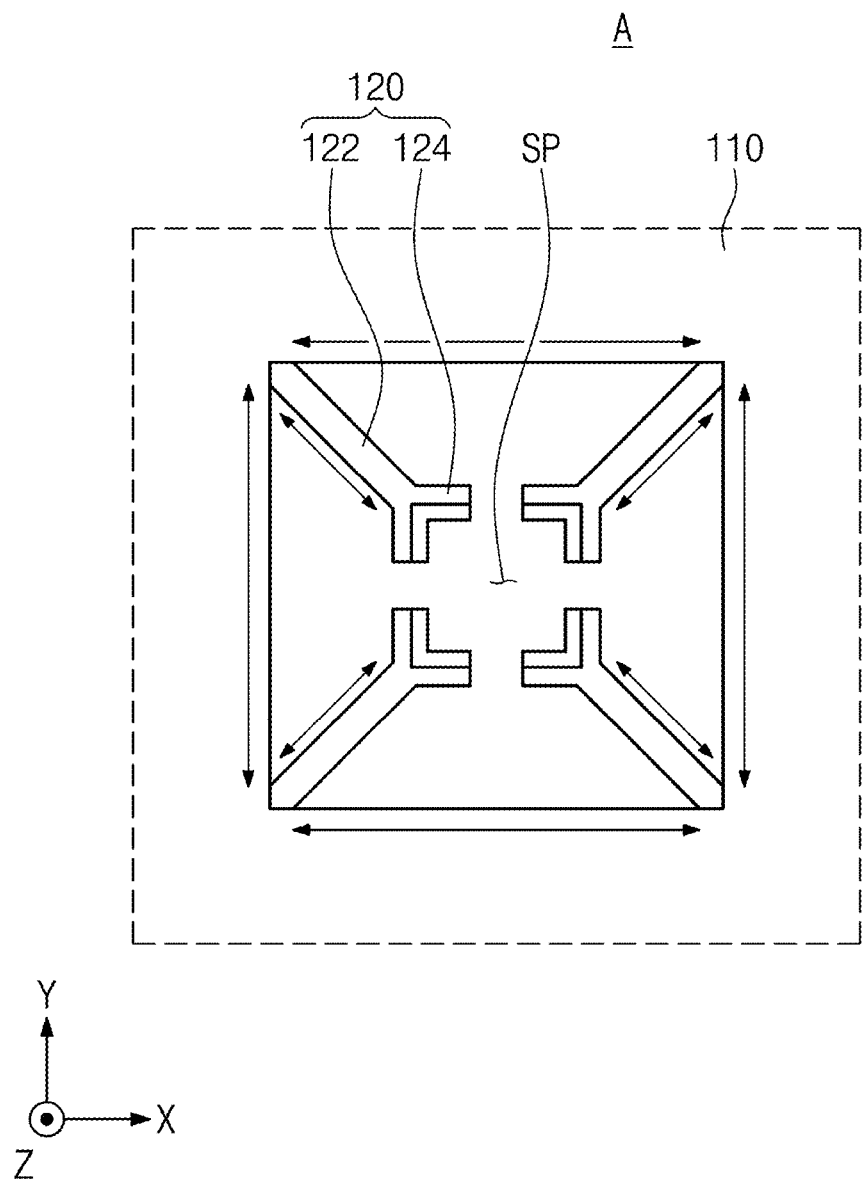

FIGS. 9 to 11 are views illustrating a pellicle holder according to a modified example of the present invention.

Referring to FIGS. 9 and 11, the pellicle holder according to the modified example may be the same as the pellicle holder according to the embodiment described above. However, in the pellicle holder according to the modified example, the outer frame 110 may further include a guide rail GR. According to one embodiment, the guide rail GR may be disposed on an inner side wall of the outer frame 110 in which the holding leg 120 is disposed. In more detail, the guide rail GR may be disposed on the inner side wall parallel to the side of the outer frame 110.

In this case, the holding leg 120 may move along the guide rail GR. Accordingly, the holding leg 120 included in the pellicle holder according to the modified example may be extended or contracted in the extension direction, and may move in an extension direction of the side of the outer frame 110. As a result, the pellicles of various sizes can be easily seated in the pellicle holder according to the modified example.

Referring again to FIG. 1, the light source 200 may irradiate the EUV light. According to one embodiment, a wavelength of the EUV light irradiated from the light source 200 may be the same as a wavelength of a light source generated in an exposure device used in a conventional pellicle transmittance measurement device for an EUV exposure process. For example, the wavelength of the EUV light may be about 13.5 nm.

The EUV light irradiated from the light source 200 may be provided to the splitter 300. The splitter 300 may transmit a portion of the EUV light irradiated from the light source 200 and reflect the remaining portion of the EUV light. The EUV light reflected from the splitter 300 may be provided to the first detector 400. Meanwhile, the EUV light transmitted through the splitter 300 may be provided to the reflector 500.

The first detector 400 may measure the EUV light reflected from the splitter 300. For example, the first detector 400 may measure a luminescence intensity and the like of the EUV light reflected from the splitter 300.

The reflector 500 may reflect the EUV light transmitted through the splitter 300 to provide the EUV light to the pellicle P seated on the pellicle holder 100. According to one embodiment, an incident angle of the EUV light provided to the pellicle P may be the same as an incident angle of the light source irradiated to the pellicle by the exposure device used in the conventional pellicle transmittance measurement device for the EUV exposure process. For example, the incident angle of the EUV light which is incident on the pellicle P seated on the pellicle holder 100 may be about 6°.

According to one embodiment, the reflector 500 may include a first reflecting mirror 510 and a second reflecting mirror 520. The first reflecting mirror 510 may reflect the EUV light transmitted through the splitter 300 to provide the EUV light to the second reflecting mirror 520. The second reflecting mirror 520 may receive the EUV light reflected from the first reflecting mirror 510 to reflect the EUV light to the pellicle P. For example, the first reflecting mirror 510 and the second reflecting mirror 520 may be spherical mirrors, planar mirrors, concave lenses, convex lenses, and the like. In other words, a path of the EUV light is controlled through the first reflecting mirror 510 and the second reflecting mirror 520, so that the EUV light may be provided to the pellicle P at an incident angle of about 6°.

According to one embodiment, the stage S may be disposed under the pellicle holder 100. The mask M may be mounted on the stage S. In this case, the mask M and the pellicle P may face each other. Accordingly, the EUV light provided to the pellicle P may be transmitted through the pellicle P and provided to the mask M.

According to one embodiment, the mask M may be a mask for an EUV exposure process, which has a reflective structure. For example, the mask M may have a structure in which a molybdenum (Mo) thin film and a silicon (Si) thin film are alternately stacked. Accordingly, the EUV light provided to the mask M may be reflected by the mask M. The EUV light reflected from the mask M may be provided to the pellicle P again. The EUV light provided to the pellicle P may be transmitted through the pellicle P.

In other words, the EUV light provided to the pellicle P through the reflector 500 may be transmitted through the pellicle P, reflected by the mask M, and retransmitted through the pellicle P.

The EUV light retransmitted through the pellicle P may be provided to the second detector 600. The second detector 600 may measure the luminescence intensity of the EUV light which is transmitted through the pellicle P, reflected by the mask M, and retransmitted through the pellicle P. For example, the second detector 600 may measure the luminescence intensity and the like of the EUV light which is retransmitted through the pellicle P.

According to one embodiment, a transmittance of the pellicle P may be calculated by comparing the EUV light measured by the first detector 400 with the EUV light measured by the second detector 600. In addition, a defect of the pellicle P may be inspected by using the calculated transmittance of the pellicle P.

In detail, the transmittance of the pellicle P may be calculated through a ratio of luminescence intensity values of the EUV light measured by the first detector 400 and the EUV light measured by the second detector 600. For example, the transmittance of the pellicle P may be calculated through <Equation 1> below.

$$\text{Transmittance of Pellicle} = \sqrt{\frac{\text{Luminescence Intensity of } EUV \text{ Light Measured by Second Detector}}{\text{Luminescence Intensity of } EUV \text{ Light Measured by First Detector}}} \quad \langle\text{Equation 1}\rangle$$

In addition, the pellicle inspection apparatus according to the embodiment described above may detect the EUV light which is transmitted through the pellicle P, reflected by the mask M, and retransmitted through the pellicle P. Accordingly, image transfer characteristics of the mask M can be easily evaluated. However, in the case of the conventional pellicle transmittance measurement device for the EUV exposure process, which has a transmissive structure, the EUV light is transmitted through the pellicle P only once, so that it is difficult to evaluate the image transfer characteristics of the mask M.

In other words, the pellicle inspection apparatus according to the embodiment of the present invention includes: a light source 200 configured to irradiate EUV light; a splitter 300 configured to transmit a portion of the EUV light irradiated from the light source 200 and reflect the remaining portion of the EUV light; a first detector 400 configured to measure the EUV light reflected from the splitter 300; a reflector 500 configured to reflect the EUV light transmitted through the splitter 300 and provide the EUV light to a pellicle P; a second detector 600 configured to measure the EUV light which is transmitted through the pellicle P, reflected by the mask M, and retransmitted through the pellicle P; and a pellicle holder 100 configured to arrange the pellicle P on the mask M such that the pellicle P faces the mask M while being spaced apart from the mask M, wherein a defect of the pellicle P is inspected by comparing the EUV light measured by the first detector 400 with the EUV light measured by the second detector 600.

Accordingly, the pellicle inspection apparatus capable of easily evaluating the image transfer characteristics of the mask M as well as the defect of the pellicle P can be provided. In addition, the pellicle inspection apparatus capable of inspecting the defect of the pellicle P with a simplified process and a reduced cost in the same transmittance measurement environment as in the case of using the exposure device which is expensive equipment can be provided.

As such, the pellicle inspection apparatus according to the embodiment of the present invention has been described. Hereinafter, a pellicle inspection method according to the embodiment of the present invention will be described. The pellicle inspection method according to the embodiment of the present invention will be described with reference to the pellicle inspection apparatus described in FIGS. 1 to 11.

Figure 12:
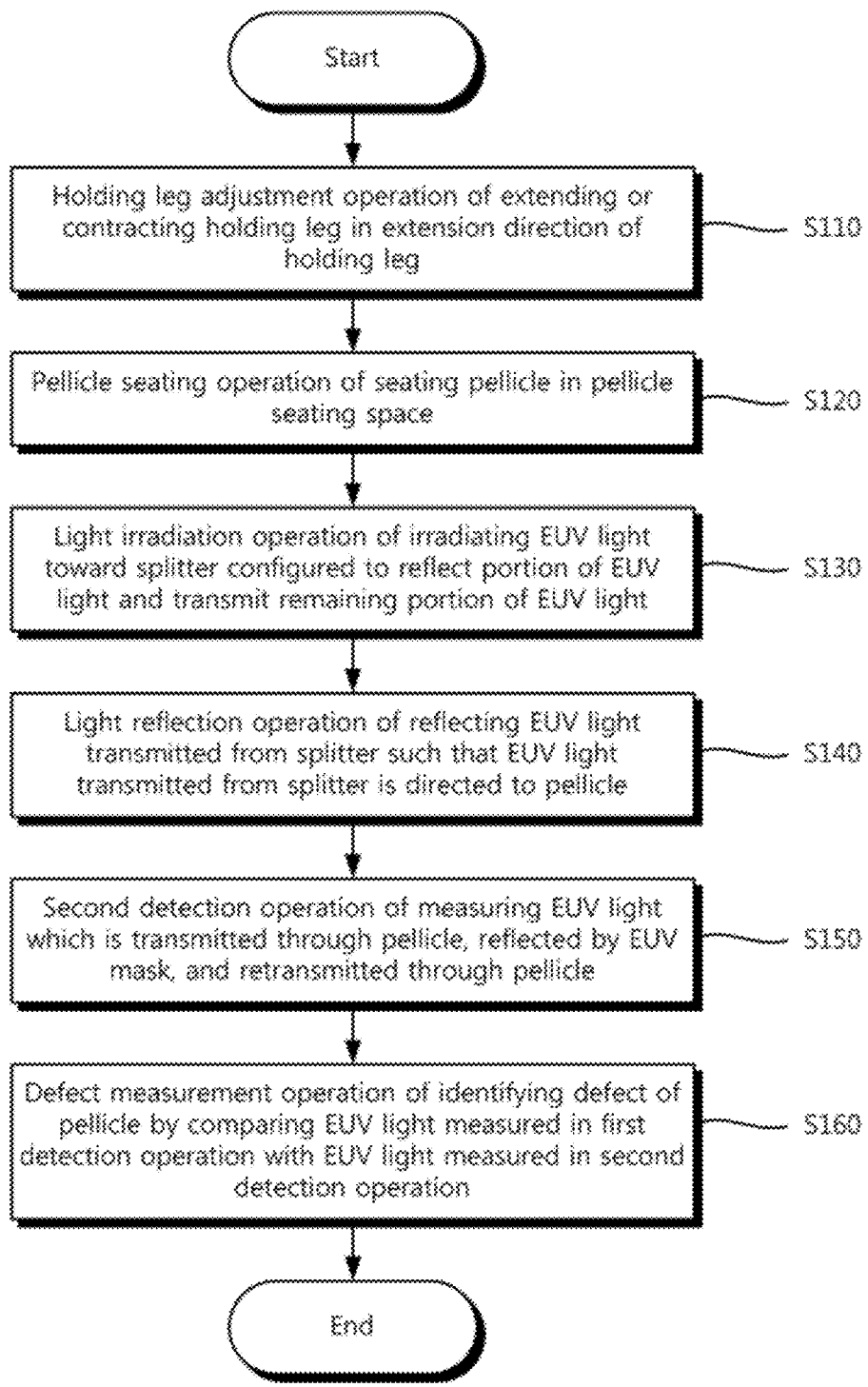
FIG. 12 is a flowchart illustrating a pellicle inspection method according to the embodiment of the present invention.

FIG. 12 is a flowchart illustrating a pellicle inspection method according to the embodiment of the present invention.

Referring to FIG. 12, the pellicle inspection method according to the embodiment may include a holding leg adjustment operation S100, a pellicle seating operation S200, a light irradiation operation S300, a first detection operation S400, a light reflection operation S500, a second detection operation S600, and a defect measurement operation S700. Hereinafter, each of the operations will be described in detail.

In the extension direction of the holding leg 120 included in the pellicle inspection apparatus described with reference to FIGS. 1 to 11, the holding leg 120 may be extended or contracted (S100). According to one embodiment, a degree of the extension or contraction of the holding leg 120 may vary depending on a size of the pellicle P supported by the holding leg 120. After the extension or contraction of the holding leg 120 is controlled, the pellicle P may be seated in the pellicle seating space SP included in the pellicle holder 100 (S200). Accordingly, the pellicle P may be easily seated on the pellicle holder 100 regardless of the size of the pellicle P.

According to one embodiment, before or after the holding leg adjustment operation S100 and the pellicle seating operation S200, a reflective mask M for the EUV exposure process may be prepared under the pellicle holder 100 such that the reflective mask M faces the pellicle P while being spaced apart from the pellicle P. In other words, before the pellicle P is prepared in the pellicle holder 100, the mask M may be prepared. Alternatively, the mask M may be prepared after the pellicle is prepared in the pellicle holder 100.

After the pellicle P and the mask M are prepared, the EUV light may be irradiated from the light source 200 toward the splitter 300 (S300). The wavelength of the EUV light may be the same as the wavelength of the light source generated in the exposure device used in the conventional pellicle transmittance measurement device for the EUV exposure process. For example, the wavelength of the EUV light may be about 13.5 nm.

The splitter 300 may reflect a portion of the EUV light and transmit the remaining portion of the EUV light. The EUV light reflected from the splitter 300 may be measured by the first detector 400 (S400). Meanwhile, the EUV light transmitted from the splitter 300 may be reflected through the reflector 500 (S500).

The EUV light reflected through the reflector may be provided to the pellicle P. The EUV light may be transmitted through the pellicle P. The EUV light transmitted through the pellicle P may be provided to the mask M. The mask M may reflect the EUV light. The EUV light reflected from the mask M may be provided to the pellicle P again. The EUV light reflected from the mask M may be retransmitted through the pellicle P. The EUV light retransmitted through the pellicle P may be measured through the second detector 600 (S600). In other words, the EUV light reflected through the reflector may be transmitted through the pellicle P, reflected by the mask M, and retransmitted through the pellicle P.

Thereafter, the defect of the pellicle may be identified by comparing the EUV light measured in the first detection operation S400 with the EUV light measured in the second detection operation S600. In detail, the transmittance of the pellicle P may be calculated through the ratio of the luminescence intensity values of the EUV light measured in the first detection operation S400 and the EUV light measured in the second operation S600. Next, the defect of the pellicle P may be identified by using the transmittance of the pellicle P.

As such, the pellicle inspection method according to the embodiment of the present invention has been described. Hereinafter, specific experimental examples and characteristic evaluation results of the pellicle inspection apparatus according to the embodiment of the present invention will be described.

Figure 13:
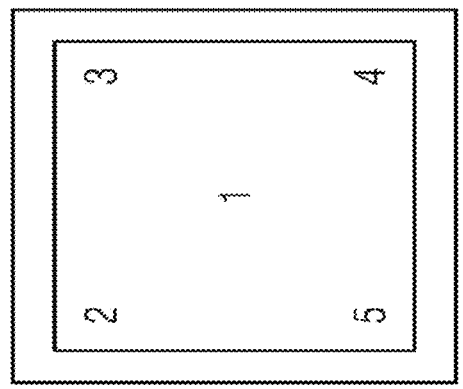
FIG. 13 is an image illustrating a measurement point of the pellicle where a transmittance of the pellicle is measured during a pellicle transmittance measurement experiment through the pellicle inspection apparatus according to the embodiment of the present invention.
Figure 13:
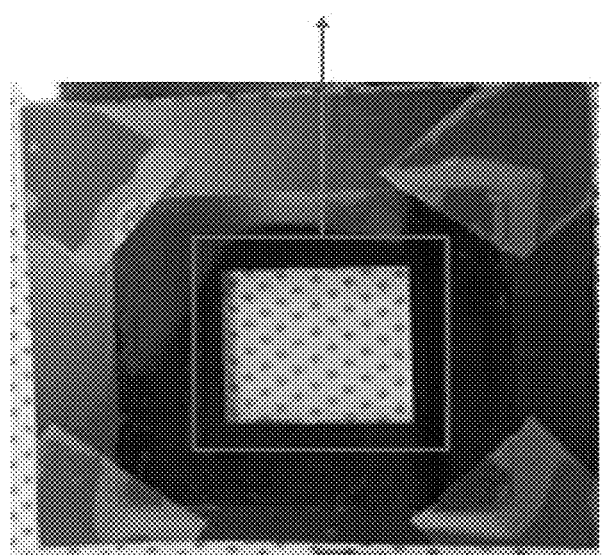
Figure 14:
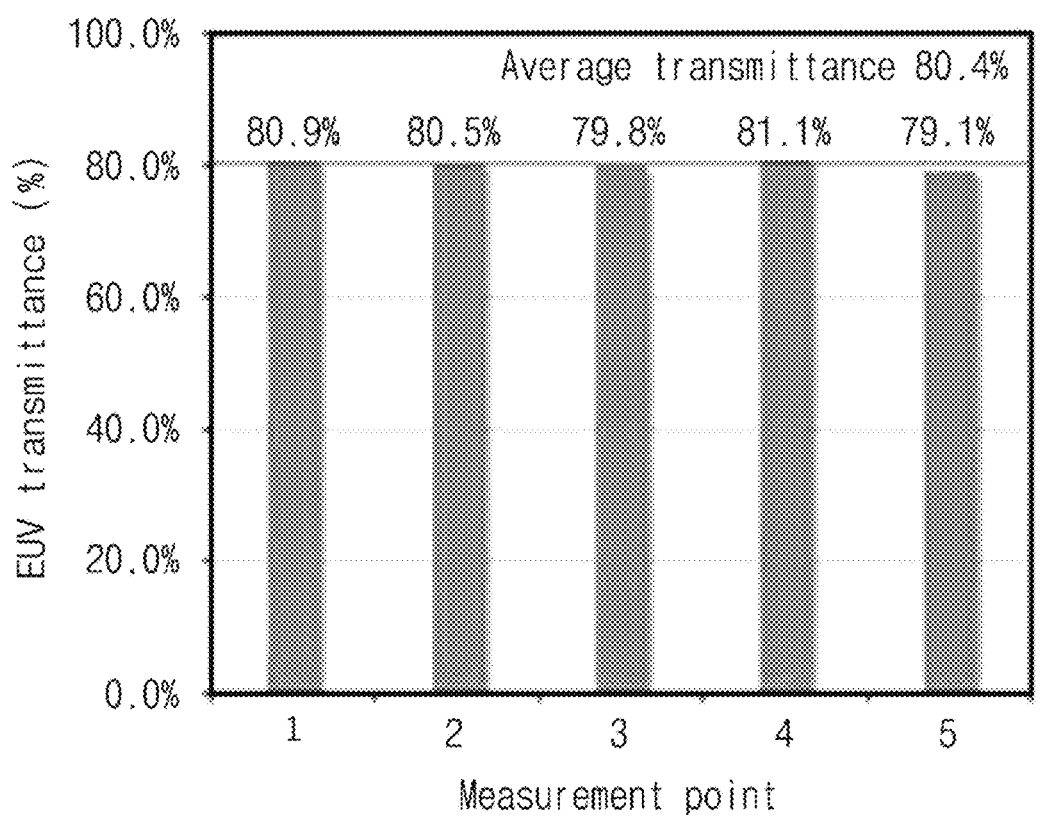
FIG. 14 is a graph illustrating results of the transmittance of the pellicle measured in FIG. 13.

FIG. 13 is an image illustrating a measurement point of the pellicle where a transmittance of the pellicle is measured during a pellicle transmittance measurement experiment through the pellicle inspection apparatus according to the embodiment of the present invention, and FIG. 14 is a graph illustrating results of the transmittance of the pellicle measured in FIG. 13.

Referring to FIGS. 13 and 14, measurement points are set as to 1 to 5 in a pellicle membrane portion, and a transmittance (EUV transmittance, %) was measured and shown for each of the measurement points. As a result, as can be seen in FIG. 14, the transmittance was 80.9% in a 1 point region, the transmittance was 80.5% in a 2 point region, the transmittance was 79.8% in a 3 point region, the transmittance was 81.1% in a 4 point region, the transmittance was 79.1% in a 5 point region, and it was observed that an average transmittance is 80.4%.

Figure 15:
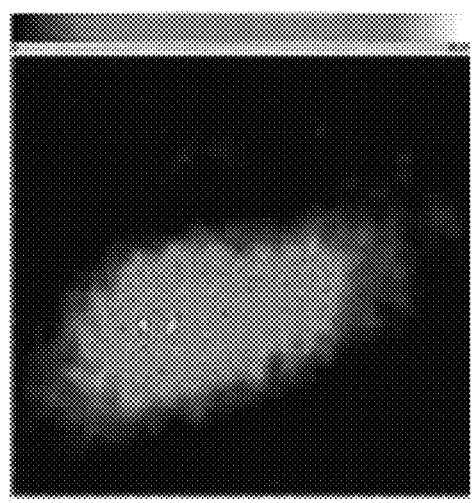
FIG. 15 is a view illustrating a signal obtained by collecting EUV light, which is transmitted through the pellicle, reflected by a mask, and retransmitted through the pellicle, by using a CCD camera.
Figure 15:
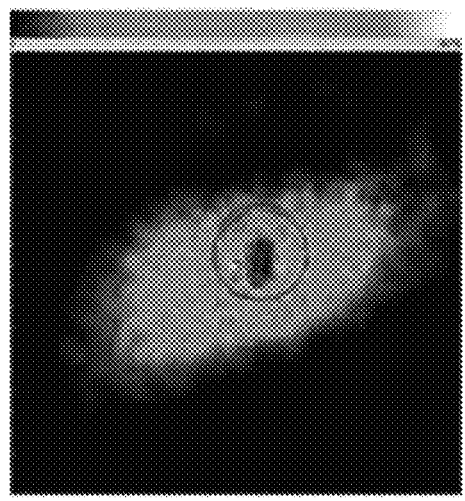

FIG. 15 is a view illustrating a signal obtained by collecting EUV light, which is transmitted through the pellicle, reflected by a mask, and retransmitted through the pellicle, by using a CCD camera.

Referring to FIGS. 15(a) and 15(b), after providing the EUV light to each of contaminated and uncontaminated pellicles, the EUV light reflected from the mask and retransmitted through the pellicle is collected by the CCD camera and shown in the drawing. As can be seen in FIG. 15(b), it was observed that the EUV light is absorbed by contaminants in the contaminated pellicle without being transmitted through the pellicle, so that a black portion was found in the drawing.

Figure 16:
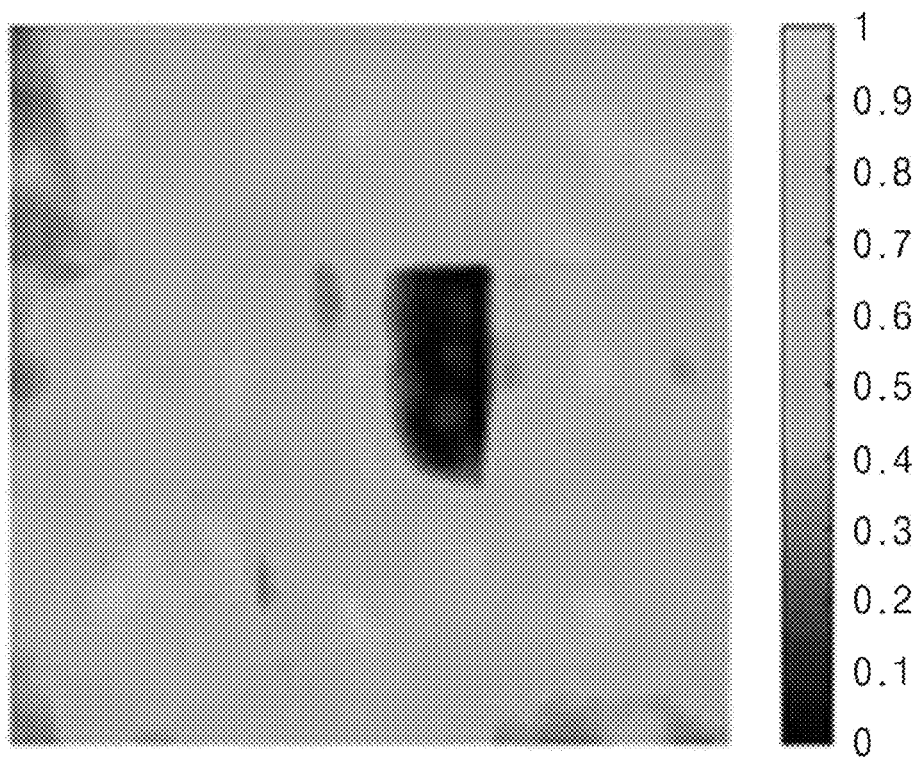
FIG. 16 is a view illustrating a defect map obtained by inspecting various regions of a contaminated pellicle.

FIG. 16 is a view illustrating a defect map obtained by inspecting various regions of a contaminated pellicle.

Referring to FIG. 16, after preparing the contaminated pellicle, contamination measurements was performed by the pellicle inspection apparatus according to the embodiment, and results of the contamination measurements are shown in the drawing. As can be seen in FIG. 16, it was observed that the pellicle inspection apparatus according to the embodiment may perform pellicle inspection over a large area.

Figure 17:
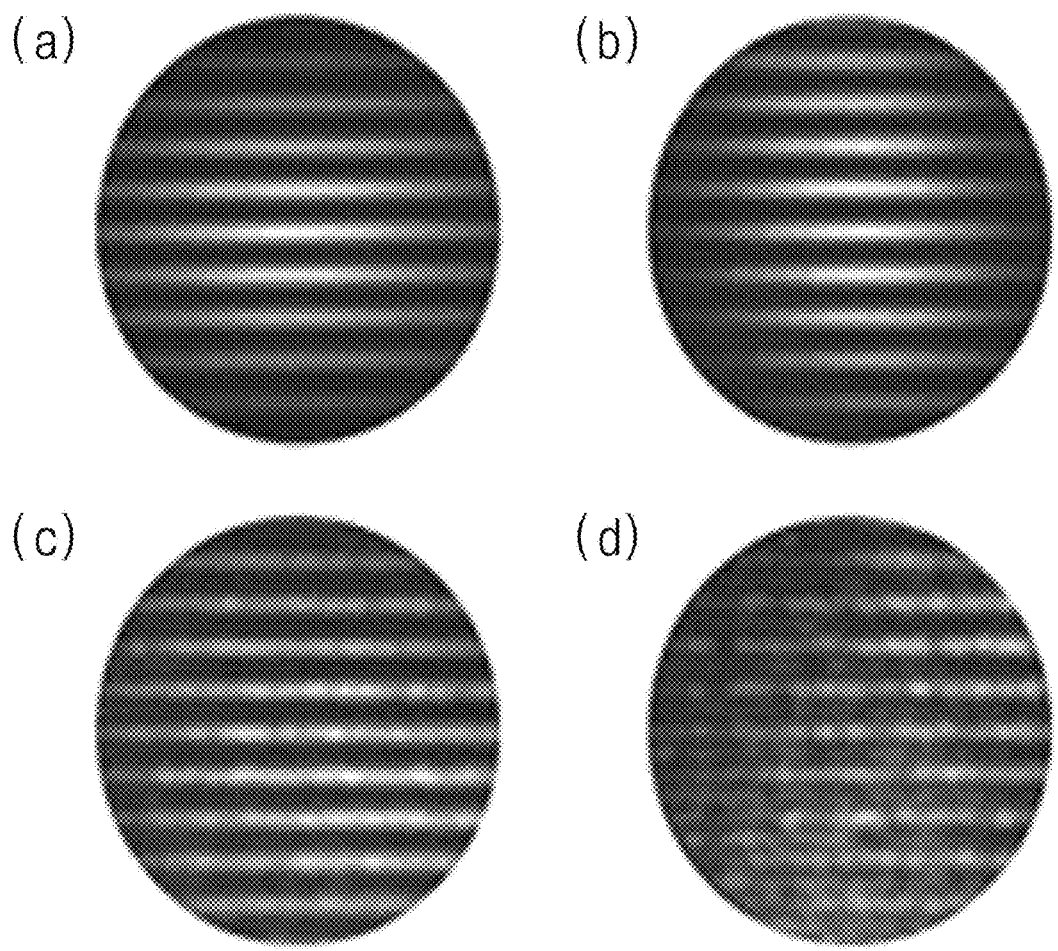
FIG. 17 is an aerial image for identifying image transfer characteristics of an EUV mask, which vary depending on each of pellicles having mutually different transmittances.
Figure 18:
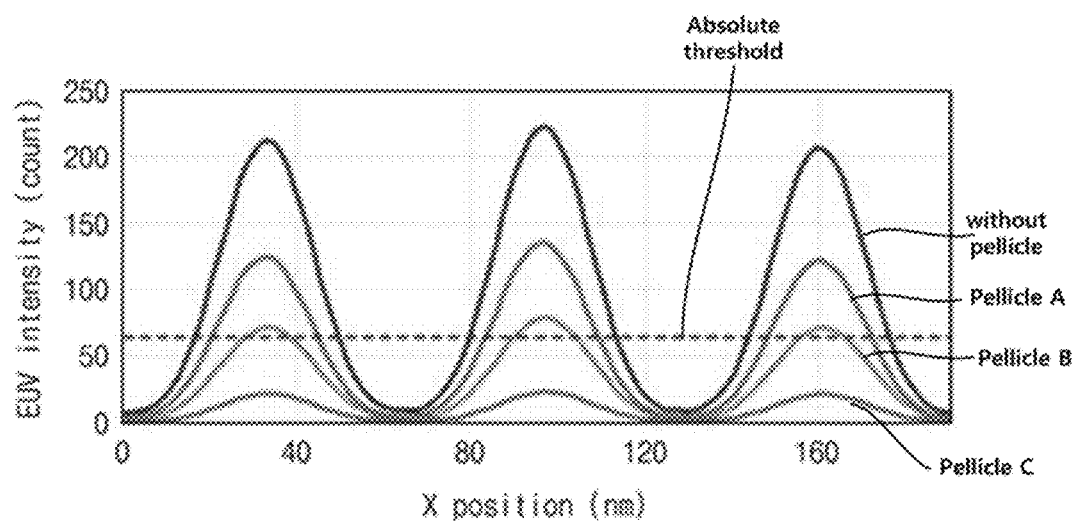
FIG. 18 is a graph illustrating a luminescence intensity of the EUV light which is transmitted through the pellicles having mutually different transmittances, reflected by the EUV mask, and retransmitted through the pellicles.

FIG. 17 is an aerial image for identifying image transfer characteristics of an EUV mask, which vary depending on each of pellicles having mutually different transmittances, and FIG. 18 is a graph illustrating a luminescence intensity of the EUV light which is transmitted through the pellicles having mutually different transmittances, reflected by the EUV mask, and retransmitted through the pellicles.

Referring to FIG. 17, after preparing the pellicle inspection apparatus according to the embodiment of the present invention, the EUV light was irradiated to the pellicle, and an aerial image of the EUV mask was obtained and shown in FIGS. 17(a) to 17(d) for a case where the pellicle is not seated, a case where a pellicle having a transmittance of 80% (Pellicle A) is seated, a case where a pellicle having a transmittance of 60% (Pellicle B) is seated, and a case where a pellicle having a transmittance of 40% (Pellicle C) is seated, respectively.

As can be seen in FIGS. 17(a) to 17(d), it was observed that clarity of the aerial image of the EUV mask decreases as the transmittance of the pellicle is decreased. In other words, it was observed that the transmittance of the pellicle affects the image transfer characteristics of the EUV mask.

Referring to FIG. 18, after preparing the pellicle inspection apparatus according to the embodiment of the present invention, the EUV light was irradiated, and the luminescence intensity (EUV intensity) of the EUV light, which is transmitted through the pellicle, reflected by the EUV mask, and retransmitted through the pellicle, was measured and shown for each of the case where the pellicle is not seated (without pellicle), the case where the pellicle having the transmittance of 80% (Pellicle A) is seated, the case where the pellicle having the transmittance of 60% (Pellicle B) is seated, and the case where the pellicle having the transmittance of 40% (Pellicle C) is seated.

As can be seen in FIG. 18, it was observed that the measured luminescence intensity of the EUV light decreases as the transmittance of the pellicle is decreased. In other words, it was observed that the transmittance of the pellicle affects the luminescence intensity of the EUV light.

Although the preferred embodiments of the present invention have been described in detail as described above, the scope of the present invention is not limited to the embodiments and should be construed by the appended claims. Further, it should be understood that those skilled in the art to which the present invention pertains may variously change and modify the present invention without departing from the scope of the present invention.

What is claimed is:

1. A pellicle holder for holding a pellicle, comprising:
   an outer frame including a plurality of pellicle seating spaces; and
   a plurality of holding legs extending in a direction from the outer frame toward a center of the pellicle seating space,
   wherein each holding leg is configured to be extended or contracted in the direction,
   wherein the pellicle comprises a pellicle membrane and a pellicle frame supporting the pellicle membrane, and
   wherein a holding head having a branch shape is formed at one end of the holding leg, and the pellicle frame is supported by the branch shape of the holding head such that the pellicle frame is spaced apart from a mask when the pellicle holder is disposed on the mask.

2. The pellicle holder of claim 1, wherein the holding head is divided into an upper region and a lower region having a lower level than the upper region, and
   wherein the upper region and the lower region are configured as a step shape.

3. The pellicle holder of claim 2, wherein a frame of the pellicle is mounted on the lower region of the holding head.

4. The pellicle holder of claim 3, wherein the holding legs include first to fourth holding legs,
   wherein the frame of the pellicle includes first to fourth corners,
   wherein the first corner is mounted on the lower region of the holding head included in the first holding leg,
   wherein the second corner is mounted on the lower region of the holding head included in the second holding leg,
   wherein the third corner is mounted on the lower region of the holding head included in the third holding leg, and
   wherein the fourth corner is mounted on the lower region of the holding head included in the fourth holding leg.

5. The pellicle holder of claim 1, wherein the holding leg supports the pellicle such that the pellicle is disposed on a mask, which reflects extreme ultraviolet (EUV) light, to face the mask while being spaced apart from the mask.

6. The pellicle holder of claim 1, wherein the outer frame includes a plurality of pellicle seating spaces, and
wherein a plurality of pellicles are seated in the pellicle seating spaces, respectively.

7. The pellicle holder of claim 1, wherein pellicles having mutually different sizes are supported as the holding leg is extended or contracted.

8. A pellicle inspection method for inspecting a defect of a pellicle seated on a pellicle holder according to claim 1, the pellicle inspection method comprising:
- a holding leg adjustment operation of extending or contracting a holding leg in an extension direction of the holding leg;
- a pellicle seating operation of seating the pellicle in a pellicle seating space;
- a light irradiation operation of irradiating extreme ultraviolet (EUV) light toward a splitter configured to reflect a portion of the EUV light and transmit a remaining portion of the EUV light;
- a first detection operation of measuring the EUV light reflected from the splitter;
- a light reflection operation of reflecting the EUV light transmitted from the splitter such that the EUV light transmitted from the splitter is directed to the pellicle;
- a second detection operation of measuring the EUV light which is transmitted through the pellicle, reflected by an EUV mask, and retransmitted through the pellicle; and
- a defect measurement operation of identifying a defect of the pellicle by comparing the EUV light measured in the first detection operation with the EUV light measured in the second detection operation.

9. A pellicle inspection apparatus for protecting a mask used in an extreme ultraviolet (EUV) lithography process, the pellicle inspection apparatus comprising:
- a light source configured to irradiate EUV light;
- a splitter configured to transmit a portion of the EUV light irradiated from the light source and reflect a remaining portion of the EUV light;
- a first detector configured to measure the EUV light reflected from the splitter;
- a reflector configured to reflect the EUV light transmitted through the splitter and provide the EUV light to a pellicle;
- a second detector configured to measure the EUV light which is transmitted through the pellicle, reflected by the mask, and retransmitted through the pellicle; and
- a pellicle holder configured to arrange the pellicle on the mask such that the pellicle faces the mask while being spaced apart from the mask,
wherein a defect of the pellicle is inspected by comparing the EUV light measured by the first detector with the EUV light measured by the second detector,
wherein the pellicle holder comprises:
- an outer frame including a plurality of pellicle seating spaces; and
- a plurality of holding legs extending in a direction from the outer frame toward a center of the pellicle seating space,
wherein each holding leg is configured to be extended or contracted in the direction,
wherein the pellicle comprises a pellicle membrane and a pellicle frame supporting the pellicle membrane, and
wherein a holding head having a branch shape is formed at one end of the holding leg, and the pellicle frame is supported by the branch shape of the holding head such that the pellicle frame is spaced apart from the mask when the pellicle holder is disposed on the mask.

10. The pellicle inspection apparatus of claim 9, wherein the reflector includes:
- a first reflecting mirror configured to reflect the EUV light transmitted through the splitter; and
- a second reflecting mirror configured to receive the EUV light reflected from the first reflecting mirror and reflect the received light to the pellicle.

* * * * *